United States Patent [19]
Chrepta et al.

[11] 3,979,272
[45] Sept. 7, 1976

[54] METHOD OF PRODUCING SEMICONDUCTOR DEVICES WITH MINORITY CHARGE CARRIERS HAVING A LONG LIFETIME AND DEVICES PRODUCED THEREBY

[75] Inventors: Metro M. Chrepta, Neptune; Harold Jacobs, West Long Branch, both of N.J.

[73] Assignee: The United States of America as represented by the Secretary of the Army, Washington, D.C.

[22] Filed: July 18, 1974

[21] Appl. No.: 489,872

[52] U.S. Cl. .................................. 204/192; 29/584; 148/1.5; 148/183; 357/91
[51] Int. Cl.[2] ............... H01L 21/203; H01L 21/265; H01L 21/38
[58] Field of Search ............... 357/91; 148/1.5, 171, 148/183; 333/31 A, 98 R; 29/584, 585, 586, 569; 204/192

[56] References Cited
UNITED STATES PATENTS

| | | | |
|---|---|---|---|
| 2,750,541 | 6/1956 | Ohl .................................. | 357/91 X |
| 2,787,564 | 4/1957 | Shockley .......................... | 357/91 X |
| 2,842,466 | 7/1958 | Moyer .............................. | 357/91 X |
| 2,932,878 | 4/1960 | Jacobs ............................. | 148/1.5 UX |

OTHER PUBLICATIONS

Wentorf, Jr. et al., "Semiconducting Diamonds by Ion Bombardment" in Physical Review, 1 Mar. 1967; pp. A1614–A1616.

*Primary Examiner*—Alfred E. Smith
*Assistant Examiner*—Marvin Nussbaum
*Attorney, Agent, or Firm*—Nathan Edelberg; Jeremiah G. Murray; Frank Dynda

[57] ABSTRACT

A method of fabricating semiconductor devices having a long lifetime for the minority charge carriers by applying a voltage across one electrode composed of a piece of intrinsic semiconductor material and another electrode composed of an alloy including an impurity. The two electrodes are moved into proximity to cause an arc to be drawn therebetween which etches out a region of the semiconductor and in turn vaporizes the alloy which is deposited and implanted in the etched region to form a junction device. In one form of device produced in accordance with the process a series of regions alternately of opposite conductivity (P and N) type are formed on the semiconductor in spaced relationship and the device is positioned in electrical contact with the surface of a semiconductor dielectric waveguide. The P and N regions of the device are electrically biased to cause a controllable excess minority carrier density making the device highly conductive and capable of changing the wavelength of a signal transmitted through the waveguide to effect a desired phase shift.

6 Claims, 5 Drawing Figures

METHOD OF PRODUCING SEMICONDUCTOR DEVICES WITH MINORITY CHARGE CARRIERS HAVING A LONG LIFETIME AND DEVICES PRODUCED THEREBY

The invention described herein may be manufactured and used by or for the Government for governmental purposes without the payment of any royalties thereon or therefor.

BACKGROUND OF THE INVENTION

Some types of semiconductor devices are fabricated by techniques wherein doping of semiconductor material with donor and acceptor impurities is achieved by vaporizing and then recondensing a molten mixture of semiconductor material and impurities to grow crystals having the desired material characteristics. Other types are produced by alloying techniques wherein a particle of the impurities alloy is placed upon the surface of a substrate of semiconductor material and the two are heated to a temperature sufficient to cause the alloy to melt and dissolve away the adjacent semiconductor surface. The molten semiconductor alloy component is then cooled and recrystallized leaving a layer of highly doped semiconductor material and a junction of layers with the original piece of semiconductor material. The conventional diffusion process for producing semiconductor devices with junctions of two materials also requires heat.

Each of the crystal-growth, alloy and diffusion processes require that the semiconductor material be heated to a relatively high temperature, often in the order of 1,100°C to 1,200°C, to produce the required junction. This use of heat degrades the mean life of the minority charge carriers in the processed semiconductor material. In the case where silicon is used as the semiconductor material, devices with minority charge carrier lifetimes of as little as approximately one microsecond or less have been produced. While low lifetimes are tolerable in many transistors, other applications of semiconductor devices require long lifetime. These include, for example, solar cells, photoconductive cells and microwave semiconductor devices.

The problem of lifetime degradation due to the processes used in semiconductor junction formation has been overcome, to some extent, in processes which employ high-energy accelerators, e.g., the ion implant method, and do not require high temperatures. The considerable expense associated with these processes, however, limits their utility.

SUMMARY OF THE INVENTION

The present invention relates to a novel method for producing junctions in semiconductor devices in which the problems caused by the heat used in prior processes are substantially reduced. In accordance with the invention, a piece of semiconductive material on which one or more regions of an impurity material are to be implanted, is connected as the positive electrode of an electrical circuit. A material containing the impurity to be implanted serves as the other electrode and a potential is provided across the two. The two electrodes are moved into proximity to each other to draw a continuous arc discharge. This effectively etches a region of the semiconductor and, at the same time, vaporizes the impurity material which becomes implanted in the etched region to form a junction. The invention also includes novel semiconductor devices which are produced by the method.

OBJECT OF THE INVENTION

It is therefore an object of the invention to provide a method for fabricating semiconductor devices with long life-time for the minority charge carriers.

Another object is to provide a method to dope semiconductor material with impurities at moderate temperatures.

Still another object is to provide a multiple junction semiconductor device with controllable minority carrier density and high conductivity.

A further object is to provide a semiconductor device capable of effecting electrically controllable phase shifts in an adjacent waveguide.

Other and further objects of the invention will appear from the following description.

DESCRIPTION OF THE DRAWINGS

In the accompanying drawings which form part of the instant specification and which are to be read in conjunction therewith and in which like reference numerals are used to indicate like parts in the various views.

DESCRIPTION OF THE PREFERRED EMBODIMENT

Figure 5:
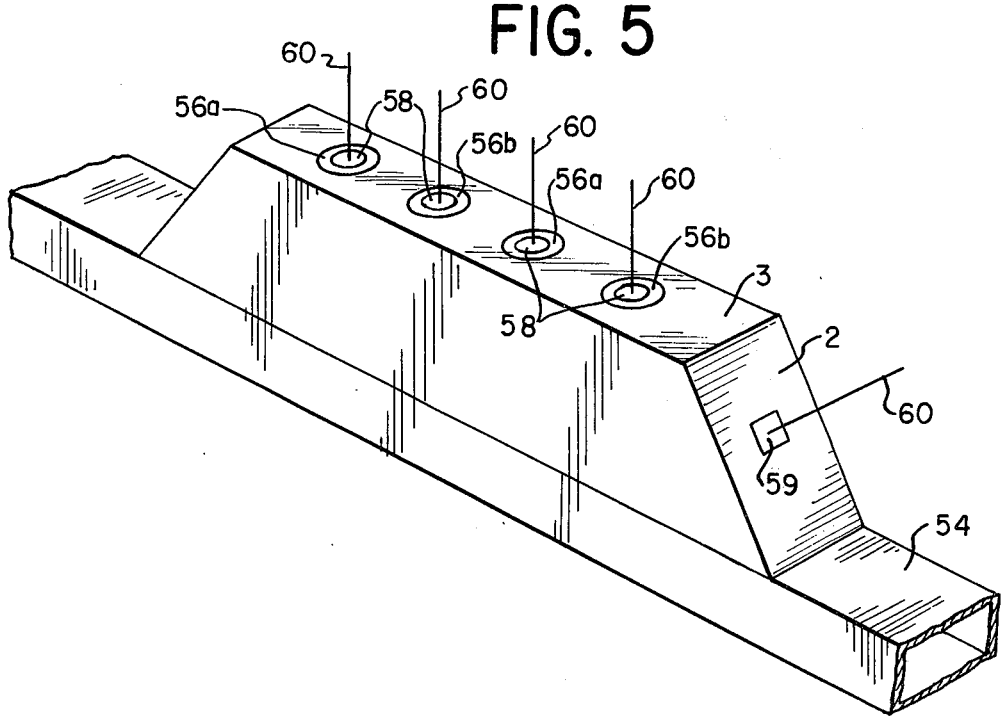
FIG. 5 is a perspective view of a semiconductor device made in accordance with the invention applied to a waveguide section to accomplish phase shifting.

Referring to the drawings, reference numeral 2 indicates a section of intrinsic semiconductor substrate material which is to be processed and which has been cut to appropriate size and shape by any suitable conventional means. In the preferred embodiment of the invention being described, high resistivity pure silicon with very long lifetime for minority charge carriers is described as the material 2 although the process will work with other materials. A configuration for the material 2 with a trapazoidal shaped cross section is described as illustrated in FIG. 5. This has been found effective for use in an electronic phase shifter, as is described below.

The cut piece of material 2 is polished, by any conventional means such as by rubbing its surfaces with a mixture of lapping powder and carrier fluid or with a metallurgical lapping paper. After the semiconductor section 2 has been cut and polished, its uppermost surface 3 is further prepared by application of a suitable etching agent. Carbon phosphide ($CP_4$) has been found effective for this purpose.

The piece of semiconductor material 2 is placed on a platform 4 made from a good heat conductor such as molybdenum, which is also electrically conductive. A protective mask 5, made of a suitable material such as quartz, is placed over the upper surface 3 of the semiconductor material 2. The mask has a cutout corresponding to the region of the material to be etched. The semiconductor 2 and mask 5 are clamped in place by a screw 6 and lever 8, or any other suitable holding means.

A wire electrode 10 is housed in a holder 11. At least the tip 10a of wire 10, is composed of an alloy containing donor or acceptor impurities, as required. The tip 10a can be shaped to be blunt, round or pointed, depending upon the desired shape of the slit to be made in the semiconductor material. To produce N-type semiconductor regions, gold antimony wire, from which donor impurites are obtained, can be used as the electrode 10. An electrode 10 of gold gallium alloy, which furnishes acceptor impurities can be used to form P-type semiconductor regions.

The electrode holder 11 is held in place by clamp 12 which is in turn connected to the elevator mechanism 14 of a micromanipulator 16 by an extension 18 of a suitable electrically insulating material, for example of Bakelite.

An electrical connector 26 is connected to the electrode 10 at the top of holder 11 to make electrical connection through a current limiting resistor 28 to the negative terminal of a DC power supply 30, illustratively shown as a battery. The positive terminal of the power supply 30 is grounded as is the platform 4 by a suitable means (not shown). The semiconductor section 2 makes intimate electrical contact with the platform 4. This forms an electrical circuit to be used for doping the impurities into the semiconductor.

Rotation of a micromanipulator control knob 20 in one direction turns a finely threaded screw 22 whose threads engage teeth 15 of the elevator mechanism 14 causing it to move downward. This in turn brings the tip 10a of electrode 10 closer toward the surface 3 of the semiconductor material 2.

In the embodiment being described, the impurity electrode 10 serves as the cathode in the impurity doping circuit 32 and the semiconductor section 2 as the anode. It has been found preferable that the impurity alloy be the cathode and the semiconductor the anode with deposition of material from cathode to anode, but for other effects, the polarity may be varied.

The wire electrode 10 is moved closer to the semiconductor surface 3 via the micromanipulator 16 until a critical gap 24 is produced at which point an electric arc is drawn from the wire tip 10a to the semiconductor surface 3.

During the manufacturing process, a protective atmosphere is maintained in the region by a bell jar 38, the base of which circumscribes the platform 4, with the semiconductor 2 upon it. The lower edge of jar 38, forms a seal on the upper surface of a base 40 on which platform 4 is mounted. The neck 41 of the bell jar 38 is covered loosely with a cap 43 which allows access to the electrode holder 11. A protective gas, for example hydrogen or nitrogen or a mixture thereof, is injected into the bell jar 38 through a gas inlet 42 form in base 40 which is connected to a gas supply 44 by the hose 46.

To increase the receptivity of the surface 3 to the doping impurities, it is heated to about 200°–300°C by a tungsten filament 34 disposed beneath the platform 4 and energized by an electrical power supply 36. The filament heater reduces temperature gradients on the surface of the semiconductor material during arcing.

Figure 1:
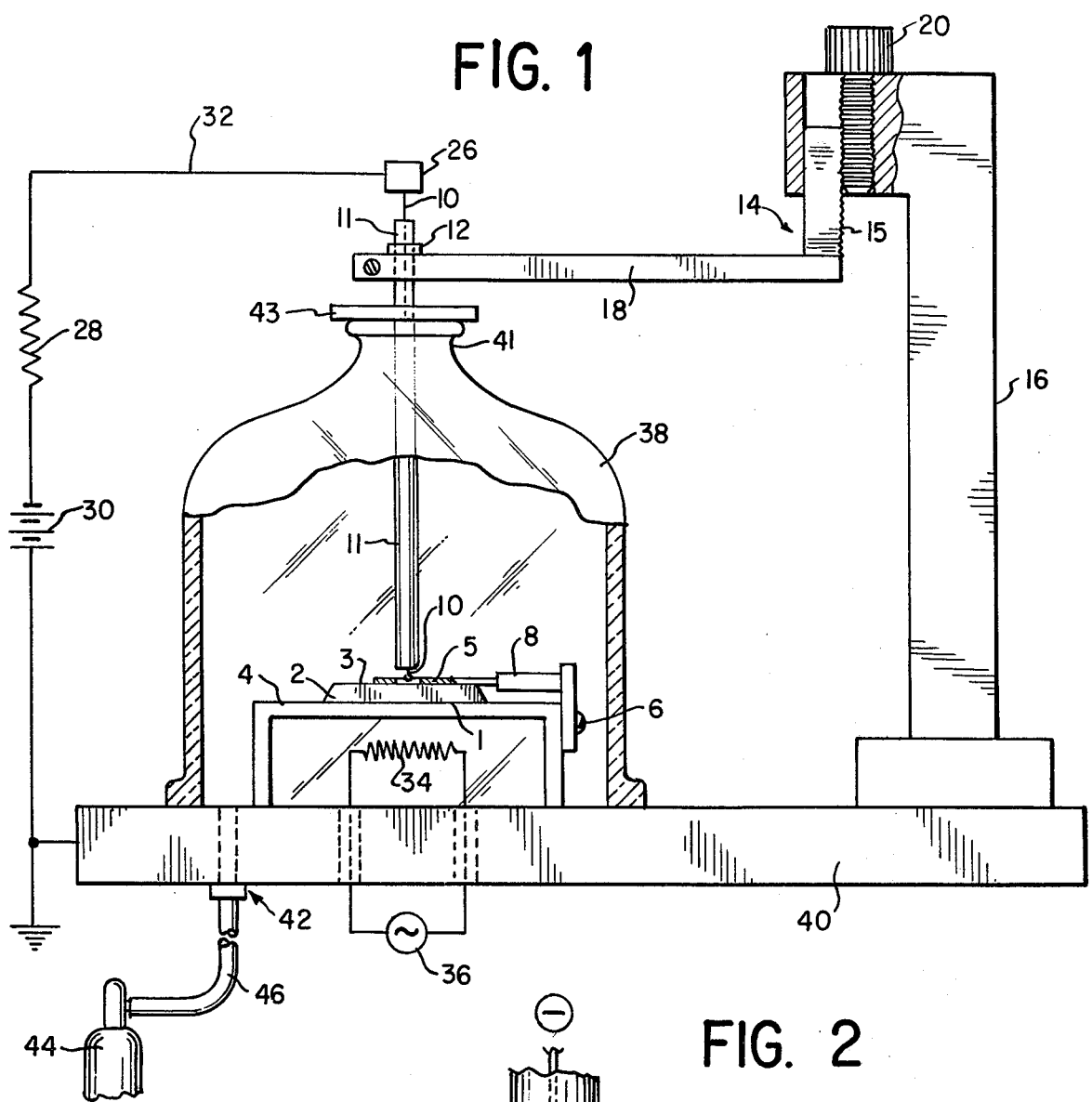
FIG. 1 is an elevation view of the apparatus employed in the semiconductor device forming process.
Figure 2:
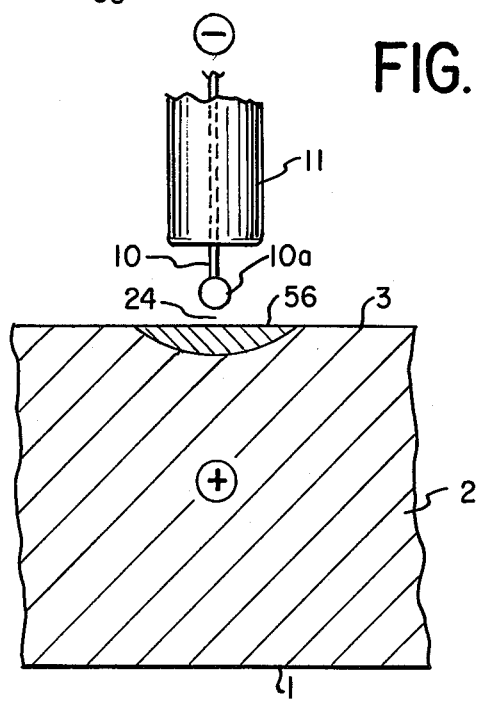
FIG. 2 is an enlarged detail view of the region between the electrode with the impurity and the piece of semiconductor material being processed.

The manipulator knob 20 is rotated to draw the arc which is held until a molten ball of alloy is formed on the anode wire (FIG. 2). During this time an arc discharge is maintained between the molten alloy and the semiconductor whereby the impurity material vaporizes, and deposits of alloy 56 are field driven into the semiconductor. The semiconductor is heated by the arc in the region immediately opposite the molten alloy electrode, thereby aiding diffusion. A junction is formed between the intrinsic semiconductor material and the impurity. In the embodiment of the invention being described the current in the doping circuit is maintained at about 300 milliamperes for about 10 to 15 minutes to produce the continuous arc and to implant the impurity material in the semiconductor.

Figure 3:
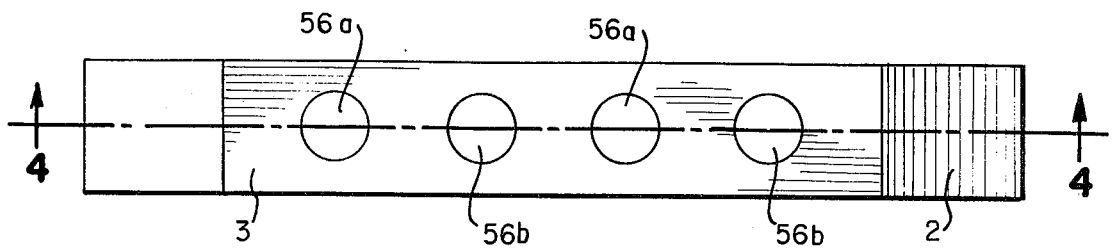
FIG. 3 is a plan view of a semiconductor device processed according to the invention with doping impurities imbedded at its surface.
Figure 4:
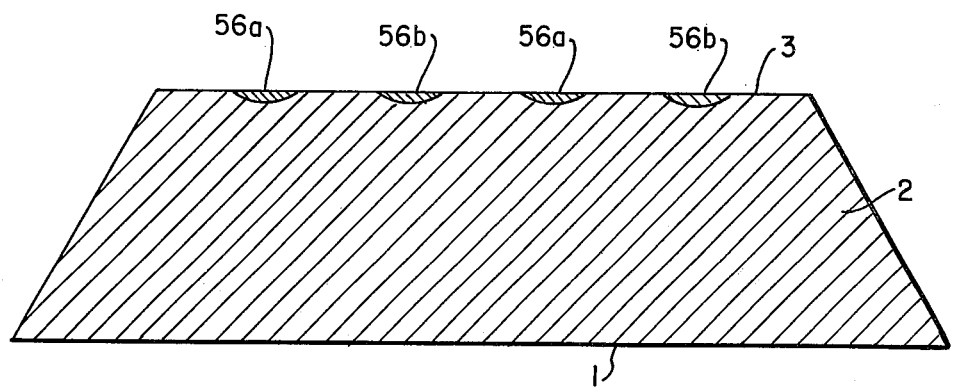
FIG. 4 is a sectional view of the device of FIG. 3 taken along lines 4—4.

The arcing process can be performed at successive regions on the semiconductor piece 2 to implant on its surface 3 selected regions 56 which can be alternate of acceptor and donor impurity regions 56a and 56b. This is shown in FIGS. 3–5 where the resultant semiconductor device is characteristic of a series of PIN diodes when forward bias is applied to it. To produce the device, after the initial impurity deposit has been made with one type of alloy, e.g., gold gallium to form a P+ region having a junction with the semiconductor, the semiconductor section 2 is repositioned on base 4 and the electrode 10 changed to the other type of impurity, e.g., gold antimony to form an N+ region. The protective quartz mask 5 is designed to permit consecutive deposits of alloy to be made at edge to edge distances of less than one millimeter without contamination between the centers of the regions 56. The process is continued with alternating deposits of gold gallium to make P+ regions and gold antimony to make N+ regions with intrinsic semiconductor material 2 separating the P+ and N+ regions, until the desired number of regions with their respective junctions with the intrinsic semiconductor material 2 have been formed.

It is preferred that the spacing between adjacent impurity regions 56 be on the order of one diffusion length with the thickness of the section 2 measured from base 1 to upper surface 3 at about 3 diffusion lengths. Under high electric field conditions produced by the electrode arc, the relationship between diffusion length and minority carrier lifetime is given by:

$$L_n = \sqrt{2 D_n T_n}$$
and
$$L_p = \sqrt{2 D_p T_p}$$

where
$L_n$ is the minority carrier diffusion length for electrons
$L_p$ is the minority carrier diffusion length for holes
$D_n$ is the diffusion coefficient for electrons
$D_p$ is the diffusion coefficient for holes
$T_n$ is the minority carrier lifetime for electrons
$T_p$ is the minority carrier lifetime for holes Since long lifetime is desirable and diffusion length increases with lifetime both the interspace between the centers of adjacent impurity regions 56 and the semiconductor section 2 thickness may be maintained at values large enough to facilitate the fabrication process.

After the desired number of regions have been formed, the semiconductor material 2 is removed from the platform 4, cooled and immersed in an etching fluid. The surface 3 of the semiconductor 2 is given a light brushing to remove the residues from the arc which have formed thereon as well as any other foreign fragments or oxides which may be present. The processed specimen is then air dried. If desired, a protective coating, for example of aluminum, can be evaporated over the regions 56.

The finished product is a semiconductor device with long minority charge carrier lifetime suitable for applications where a large concentration of excess minority carriers is required. The lifetimes of processed semiconductor devices made in accordance with the subject invention were tested with point contact probes and verified by microwave absorption techniques. The following lifetime data resulted:

After sample cutting and polishing: 250 microseconds

After $CP_4$ etching (before alloying): 250 microseconds

After forming of the regions 56: 60–100 microseconds

Thus the semiconductors produced by our process compare quite favorably to those produced by conventional alloying and crystal growth processes wherein lifetime is degraded to one microsecond or less.

Referring specifically now to FIG. 5, the process disclosed herein has been useful in fabricating an electronic phase shifter. By placing a semiconductor device 52, into which an excess of minority carriers may be introduced, adjacent to and in intimate contact with a waveguide 54, illustratively of the millimeter type, containing a semiconductor dielectric such as silicon, the wavelength of a signal transmitted through the waveguide 54 may be altered causing a phase shift therein. The semiconductor device 52 has an electrode 58 connected to each of the regions 56 and an electrode 59 connected to the substrate 2. The electrodes are formed by any suitable technique. Leads 60 connect the electrodes 58, 59 to a suitable biasing circuit (not shown) which is preferably switch or digitally controlled. When the substrate is flooded with minority carriers by appropriate biasing of one or more of the junctions formed by the regions 56, a portion of the device assumes the high conductivity characteristics of metal sections. This changes the characteristics of the waveguide 54 altering its wavelength. Conductivity is modulated by varying the bias voltages to the different regions 56 thereby altering the availability and conductivity type of minority carriers and allowing control of the degree of phase shift of millimeter waves in the waveguide 54.

In addition to their application in a waveguide phase shifter, the long lifetime semiconductor devices produced by our process are useful in other areas. For example, they can be employed in amplitude modulators for lasers, solar cells, photoconductive devices, and semiconductor transit time generators in silicon, gallium arsenide and indium phosphide, where ohmic contacts amd junctions are otherwise difficult to establish, e.g., Gunn, Impatt and Trapatt oscillators.

As can be seen, semiconductor devices fabricated in accordance with the invention can be produced having long lifetimes in the order of 60 to 100 microseconds. The apparatus necessary to carry out the process is inexpensive and the process is performed at moderate temperatures of about 200°–300°C. Those experienced in the art will appreciate that conventional junction forming processes require that the semiconductor material be heated to temperatures on the order of 1,100° to 1,200°C. The process is suited to forming an unlimited number of regions and corresponding junctions in a single section of semiconductor material of suitable size. The devices produced by the process provide for high minority carrier density and high conductivity upon proper biasing. The semiconductor devices so produced are capable of effecting controllable phase shifts in a semiconductor dielectric waveguide.

What is claimed is:

1. A process for implanting a material for producing a region of charge carriers of one conductivity type into the surface of an intrinsic semiconductor substrate comprising the steps of:

establishing a potential difference between said material and said substrate, heating said substrate by an electrical heating filament disposed beneath said substrate, moving said material into proximity to said substrate to draw a single continuous electrical arc therebetween to vaporize said material and to etch a region of the surface of said substrate, and maintaining said arc for a time sufficient to deposit an amount of the vaporized material into the etched region to form a semiconductor junction between said intrinsic semiconductor substrate and said region of charge carriers.

2. A process as in claim 1 wherein the heating of the substrate is to a temperature in the range of from about 200° to 300°C.

3. A process as in claim 1 further comprising the step of forming said material to be implanted into the shape of a wire.

4. A process as in claim 3 wherein the material to be implanted is formed of a metal alloy.

5. A process as in claim 3 wherein said alloy is gold-gallium.

6. A process as in claim 3 wherein said alloy is gold-antimony.

* * * * *